(12) United States Patent
Makinwa et al.

(10) Patent No.: US 8,896,474 B2
(45) Date of Patent: Nov. 25, 2014

(54) TWO-STAGE PHASE DIGITIZER

(71) Applicant: Stichting voor de Technische Wetenschappen, Utrecht (NL)

(72) Inventors: Kofi A. A. Makinwa, Delft (NL); Caspar Van Vroonhoven, Delft (NL)

(73) Assignee: Stichting voor de Technische Wetenschappen, Utrecht (NL)

( * ) Notice: Subject to any disclaimer, the term of this patent is extended or adjusted under 35 U.S.C. 154(b) by 0 days.

(21) Appl. No.: 13/815,225

(22) Filed: Feb. 11, 2013

(65) Prior Publication Data
US 2013/0214952 A1 Aug. 22, 2013

Related U.S. Application Data

(60) Provisional application No. 61/633,718, filed on Feb. 16, 2012.

(51) Int. Cl.
| | |
|---|---|
| H03M 1/12 | (2006.01) |
| H03M 3/02 | (2006.01) |
| H03M 1/14 | (2006.01) |
| H03M 3/00 | (2006.01) |

(52) U.S. Cl.
CPC ............... *H03M 1/12* (2013.01); *H03M 1/145* (2013.01); *H03M 3/412* (2013.01); *H03M 3/458* (2013.01)
USPC .......................................... 341/155; 341/143

(58) Field of Classification Search
CPC ....... H03M 1/12; H03M 1/145; H03M 3/412; H03M 3/458
USPC ........ 341/143, 156, 161, 163, 167 I, 169, 167
See application file for complete search history.

(56) References Cited

U.S. PATENT DOCUMENTS

| | | | | |
|---|---|---|---|---|
| 4,982,193 | A * | 1/1991 | Saul .............................. | 341/159 |
| 5,291,198 | A * | 3/1994 | Dingwall et al. ............. | 341/159 |
| 5,349,354 | A * | 9/1994 | Ito et al. ........................ | 341/156 |
| 6,121,912 | A * | 9/2000 | Brandt .......................... | 341/156 |
| 6,281,759 | B1 | 8/2001 | Coffey .......................... | 331/57 |
| 7,504,977 | B2 | 3/2009 | Doorenbos et al. ........... | 341/143 |
| 7,920,032 | B2 | 4/2011 | Makinwa et al. ............. | 331/176 |
| 8,013,636 | B2 | 6/2011 | Makinwa et al. ................. | 327/3 |
| 8,492,697 | B2 | 7/2013 | Neubauer et al. .......... | 250/208.1 |
| 8,665,130 | B2 | 3/2014 | Makinwa et al. ............. | 341/156 |
| 2007/0241950 | A1 * | 10/2007 | Petilli et al. ................... | 341/143 |
| 2007/0252747 | A1 * | 11/2007 | Lyden et al. .................. | 341/161 |
| 2011/0200070 | A1 | 8/2011 | Makinwa et al. ............. | 374/170 |
| 2012/0025062 | A1 | 2/2012 | Neubauer et al. .......... | 250/208.1 |

* cited by examiner

*Primary Examiner* — Howard Williams
(74) *Attorney, Agent, or Firm* — Steven Stupp

(57) ABSTRACT

An analog-to-digital converter (ADC) is described. This ADC converts an analog signal into a digital value using a two-pass digitization process. In a first operation, coarse digitization is performed by an averaging converter based on a set of references. Then, in a second operation, fine digitization is performed by either another averaging converter or the same averaging converter based on a subset of the set of references that is progressively closer to an instantaneous value of the analog signal. For example, the coarse digitization may be performed by a low-resolution ADC stage and the fine digitization may be performed by a sigma-delta ADC, such as a single-bit sigma-delta ADC. Moreover, the other averaging converter may use dynamic element matching to shuffle reference elements used to generate the subset. In this way, the ADC may provide high resolution with reduced nonlinearity and quantization noise.

18 Claims, 11 Drawing Sheets

TWO-STAGE PHASE DIGITIZER

CROSS REFERENCE TO RELATED APPLICATION

This application claims priority under 35 U.S.C. §119(e) to U.S. Provisional Application Ser. No. 61/633,718, entitled "Two-Stage Phase Digitizer," by Kofi A. A. Makinwa and Caspar van Vroonhoven, filed on Feb. 16, 2013, the contents of which is herein incorporated by reference.

FIELD OF THE INVENTION

The present disclosure relates generally to analog-to-digital converters (ADCs). More specifically, the present disclosure relates to an ADC that uses cascaded averaging converters to convert an analog signal to a corresponding digital value with reduced nonlinearity and reduced quantization noise.

BACKGROUND

Because of their small size, low cost, ease of use and digital output, integrated temperature sensors are widely used. These integrated temperature sensors are often based on the temperature dependence of bipolar transistors (BJTs). However, because BJTs are typically sensitive to process spread, their untrimmed inaccuracy is often limited to a few degrees Celsius. While the inaccuracy of BJTs can be improved by trimming individual devices, this usually increases production test time and the device cost. Furthermore, in advanced deep-submicron CMOS technologies (such as those used in state-of-the-art microprocessors), the performance of BJT-based temperature sensors usually deteriorates significantly. For example, temperature errors of up to 5 C have been reported. This degraded performance is at odds with the increasing need for thermal management (and for integrated temperature sensors) in microprocessors and other very-large-scale integrated circuits (ICs) because of the increasing power density and the increasing number of processing cores in such chips.

Another technique for measuring temperature (T) is via the thermal diffusivity of silicon (D), which has a $T^{-1.8}$ temperature dependence. For example, D can be determined by measuring the characteristics of an electrothermal filter (ETF). As shown in FIG. 1, an existing ETF can include a heater and a relative temperature sensor (such as a thermopile) fabricated on the substrate of a silicon chip. In the ETF, power dissipated in the heater generates heat pulses that diffuse through the silicon over a distance (s) between the heater and the temperature sensor, creating temperature fluctuations at the temperature sensor. The time it takes for these pulses to diffuse is a function of absolute temperature or, in other words, the ETF adds a temperature-dependent phase shift ($\phi_{ETF}$) to a signal at a particular frequency. When the heater is driven at a frequency ($f_{drive}$), the temperature sensor output has the same frequency but with a relative phase shift that can be approximated as $$\phi_{ETF} \propto -s\sqrt{\frac{\pi f_{drive}}{D}}.$$

At constant $f_{drive}$, $\phi_{ETF}$ has a near-linear $T^{0.9}$ temperature dependence. Therefore, ETFs can be used as temperature sensors. Note that microprocessors typically operate at well-defined clock frequencies, so that a known $f_{drive}$ is usually available in these applications.

In contrast to BJTs, ETFs usually do not require trimming because, for IC-grade silicon, D is well-defined and the distance between the heater and the relative temperature sensor is typically accurately determined by lithography. As a consequence, the inaccuracy of an ETF-based temperature sensor scales with the critical dimension of the lithographic process used. For example, ETFs with identical geometry have achieved untrimmed inaccuracies of ±0.7 C (3σ) and ±0.2 C (3σ) in 0.7 μm and 0.18 μm CMOS, respectively, indicating that the dominant source of error is lithographic spread. Therefore, the performance of ETFs is expected to improve greatly in modern microprocessors, which are implemented in even more advanced deep-submicron CMOS processes. Furthermore, because D is only weakly sensitive to doping fluctuations at the doping levels typically used in IC technology, the variation between wafers and process lots is small.

The availability of a known driving frequency together with the scaling properties of ETFs make them a promising alternative to current thermal management solutions in modern microprocessors. However, because of power-consumption constraints, the amount of power dissipated in the heater of an ETF is typically limited. In conjunction with the high thermal conductivity of silicon, this power-dissipation constraint leads to small signals at the output of the temperature sensor. Therefore, a precision readout interface is usually needed to extract $\phi_{ETF}$ (and, thus, temperature information) from these small signals.

FIG. 2 illustrates an existing system that includes a phase-detection circuit. In this circuit, the ETF is driven at a constant frequency $f_{drive}$ (which may be obtained from a digital system clock), and its phase-shifted output is multiplied with a signal at the same frequency but having a controlled phase shift ($\phi_{demod}$). Furthermore, the DC component of the multiplier output is proportional to the cosine of $\phi_{demod}-\phi_{ETF}$. The integrator in the phase-detection circuit in FIG. 2 drives the phase-shift controller so that this DC component becomes zero, which corresponds to a fixed 90° difference between the two phase shifts. As a consequence, this feedback loop functions as a narrowband and, therefore, low-noise, phase detector. While FIG. 2 includes a sine-wave drive, $f_{drive}$ can be associated with an arbitrary harmonic signal. For example, a square-wave may be used. Note that, because the ETF is a low-pass filter, the amplitude of the higher harmonics of $f_{drive}$ in its output signal will be quite small.

When the feedback loop in the phase-detection circuit is locked, the analog control signal driving the phase shifter is a measure for $\phi_{ETF}$. However, the processing of the signals output by the ETF typically requires them to be digital, and so a phase-domain analog-to-digital converter (ADC) is often used. Such an ADC digitizes the relative phase difference between two signals, both of which are at the same frequency.

As shown in FIG. 3, one way to implement a phase-domain ADC is to replace the analog-controlled phase shifter with a digital one. In this circuit, an n-bit ADC samples the integrator output at a sampling rate $f_{sample}$ (which may be oversampled for high resolution), and feedback is provided through an n-bit digital phase rotator. However, for high n (for example, more than 12 bits), the implementation of an accurate digital phase rotator or an n-bit ADC is usually non-trivial. Typically, a phase-domain sigma-delta ADC (PDΣΔ) is easier to implement.

An existing system that includes a PDΣΔ ADC is illustrated in FIG. 4. This PDΣΔ ADC is a 1-bit implementation of the phase-detection circuit shown in FIG. 3. The two phase shift references, $\phi_0$ and $\phi_1$, are digitally generated square-waves with the same frequency as the input signal and which span the phase-shift input range of interest (for clarity, the fundamental harmonics are indicated in FIG. 4). Moreover, the value of $f_{sample}$ is chosen to be substantially larger than the signal bandwidth, which is referred to as 'oversampling.' In such an oversampled modulator (which is often referred to as a 'sigma-delta modulator'), the quantization error associated with the 1-bit ADC is shifted out of the frequency band of interest through noise shaping, thereby offering high resolution after filtering by an appropriate decimation filter. The digital value obtained at the output of the decimation filter is thus a weighted average of the value of the input signal over the conversion period, and so such sigma-delta ADCs belong to the class of averaging converters. Sigma-delta ADCs are well suited for digitizing narrowband signals with high resolution, as is typically required for sensor interfacing. PDΣΔ ADCs have been successfully used to read out ETFs, achieving effective phase resolutions of up to 16 bits.

Usually, the phase-shift input range of the PDΣΔ ADC is chosen large enough to span the expected range of values for $\phi_{ETF}$ over temperature. For example, $\phi_0$ and $\phi_1$ may be −45° and +45°, respectively, so that for any $\phi_{ETF}$, the cosine of $\phi_{ETF}-\phi_0-90$ is always positive, while the cosine of $\phi_{ETF}-\phi_1-90$ is always negative. This design choice ensures stable feedback-loop operation. FIG. 5 illustrates the measured ETF phase characteristic.

ETF-based temperature sensors can offer very low untrimmed inaccuracy. In addition, the performance of ETF-based temperature sensors (e.g., the signal-to-noise ratio and the area) improves as the IC technology is scaled. However, ETF-based temperature sensors are often less linear than BJT-based sensors. For BJTs, both analog and/or digital curvature compensation can be used to remove the (relatively small) nonlinearity associated with the temperature dependence of BJTs. As a consequence, BJT-based sensors usually offer excellent linearity (at or below the ±0.2 C level) over a wide temperature range.

The nonlinearity of ETF-based temperature sensors is partially due to their $T^{0.9}$ temperature dependence, which causes a small linearity error of ±1 C over the 25-105 C temperature range (which is of interest for microprocessor thermal management applications). A more significant problem is that phase-domain ADCs, such as the PDΣΔ ADC illustrated in FIG. 4, while very precise, are typically also very non-linear. This is because the multiplier used for phase detection in a phase-domain ADC outputs a DC signal that is proportional to the cosine of the difference of the input and reference phase shifts (as opposed to the difference of the input and reference phase shifts). As a result, the error signals of a PDΣΔ ADC are nonlinear functions of the input and reference phase shifts.

In order to understand how this can lead to nonlinearity, consider FIG. 6, which shows the two PDΣΔ ADC errors signals (for $\phi_0$ equal to −45° and $\phi_1$ equal to 45°) at $\phi_{ETF}$ equal to 67.5° (which, for a particular ETF, corresponds to approximately −30 C). In FIG. 6, the two arrows indicate the PDΣΔ ADC error signals, and the curve shows the function cosine of $\phi_{ETF}-90-\phi$, which is zero at $\phi$ equal to $\phi_{ETF}$. The PDΣΔ ADC nonlinearity comes from the fact that the loop outputs a weighted combination of $\phi_0$ and $\phi_1$ so that the average DC component is zero. This is represented by the linear interpolation line in FIG. 6, which has a zero crossing corresponding to a different phase shift than $\phi_{ETF}$. Over the full phase input range, the phase error due to nonlinearity is shown in FIG. 7 (with equal to 45° and $\phi_1$ equal to −45°).

In FIG. 7 the worst-case nonlinearity is about ±4°, or nearly ±4.5% of the phase input range. A ±4° phase nonlinearity corresponds to roughly ±20 C of temperature error, which is very significant. Although this non-linearity can be removed in (digital) post-processing, this is highly resource-intensive, because FIG. 7 represents a complicated trigonometric function that relates input, output and reference phase shifts to each other. Therefore, PDΣΔ ADC nonlinearity is a serious problem.

Another problem of the first-order PDΣΔ ADC is that its quantization noise is inversely proportional to the total conversion time. While the overall noise performance of the system in FIG. 3 is currently limited by the thermal noise generated in the ETF, this may not be the case for ETFs that are scaled to smaller critical dimensions (which are sometimes referred to as 'scaled ETFs'). In addition, when shorter conversion times ($T_{conv}$) are needed, the quantization noise of the PDΣΔ ADC will increase, and the overall noise performance of the system in FIG. 3 may not be limited by the thermal noise generated in the ETF.

Therefore, there is a need for an ADC without the problems listed above.

SUMMARY OF THE INVENTION

One embodiment of the present disclosure provides an analog-to-digital converter (ADC) that includes an averaging converter that receives an analog signal and outputs a digital value corresponding to the analog signal based on a set of references, where the set of references includes a range of values of the analog signal. Moreover, the ADC includes a second averaging converter that receives the analog signal and outputs a second digital value corresponding to the analog signal based on a second set of references, where the second averaging converter selects the second set of references based on the digital value. For example, the second averaging converter may dynamically select the second set of references based on the digital value. Furthermore, the second set of references is a subset of the set of references and, in aggregate, the second set of references is closer to an instantaneous value of the analog signal than the set of references.

Note that the second set of references may facilitate more linear operation of the second averaging converter relative to the averaging converter. Thus, using the second set of references, the second digital value output by the second averaging converter may have a more linear relationship to the analog signal than the digital value output by the first averaging converter.

In some embodiments, the set of references are generated using a set of reference elements and the second set of references are generated using a subset of the set of reference elements. Moreover, the second averaging converter may dynamically select the subset of the set of reference elements used to generate the second set of references.

In some embodiments, the averaging converter dynamically selects the set of reference elements used to generate the first set of references.

Furthermore, the averaging converter may include: a sigma-delta ADC, a single-slope ADC, a pulse-width modulation ADC, a duty-cycle modulation ADC, and/or a dual-slope ADC. Additionally, the second averaging converter may include: a second sigma-delta ADC, a second single-slope ADC, a second pulse-width modulation ADC, a second duty-cycle modulation ADC, and/or a second dual-slope ADC. For example, the averaging converter may include a sigma-delta ADC, the second averaging converter may include a second sigma-delta ADC, and at least one of the sigma-delta ADC and the second sigma-delta ADC may include a first-order sigma-delta ADC. Alternatively, at least one of the sigma-delta ADC and the second sigma-delta ADC may include an $n^{th}$-order sigma-delta ADC, where n is greater than one. In some embodiments, at least one of the sigma-delta ADC and the second sigma-delta ADC includes a single-bit sigma-delta ADC.

Moreover, the averaging converter and the second averaging converter may be physically implemented by reconfiguring the references applied to a single averaging converter.

Furthermore, the second averaging converter may include a phase-domain sigma-delta (PDΣΔ) ADC that determines the second digital value based on a phase of the analog signal, and the second set of references may be selected so that the PDΣΔ ADC determines the second digital value in a linear region of operation of the PDΣΔ ADC. Additionally, the second averaging converter may select the second set of references based on the digital value and: a look-up table and/or a nonlinear function.

In some embodiments, the analog signal is provided by a filter having a phase characteristic that is a function of a physical variable. For example, the analog signal may be provided by a temperature sensor, such as an electrothermal filter (ETF). However, the analog signal may be provided by a variety of sources other than an ETF.

Another embodiment provides another ADC that includes an averaging converter that receives an analog signal and outputs digital values corresponding to the analog signal based on a set of references during time intervals, where, in a given time interval, the set of references includes a given range of values. Moreover, the other ADC includes control logic that dynamically adjusts the given range of values during the given time interval based on a digital value corresponding to the analog signal determined in a preceding time interval, where the given range of values in the given time interval is less than or equal to another range of values in the preceding time interval.

Note that the set of references during the given time interval may be generated using a subset of a set of reference elements, where, during the given time interval, the control logic dynamically selects the subset of the set of reference elements used to generate the set of references.

In some embodiments, the averaging converter includes: a sigma-delta ADC, a single-slope ADC, a pulse-width modulation ADC, a duty-cycle modulation ADC, and/or a dual-slope ADC. For example, the averaging converter may include a sigma-delta ADC, and the sigma-delta ADC may include a first-order sigma-delta ADC. Alternatively, the sigma-delta ADC may include an $n^{th}$-order sigma-delta ADC, where n is greater than one. In some embodiments, the sigma-delta ADC includes a single-bit sigma-delta ADC.

Furthermore, the averaging converter may include a PDΣΔ ADC that determines the digital values based on a phase of the analog signal, and the control logic may select the set of references so that the PDΣΔ ADC determines the digital values in a linear region of operation of the PDΣΔ ADC.

In some embodiments, the analog signal is provided by a filter having a phase characteristic that is a function of a physical variable. For example, the analog signal may be provided by a temperature sensor, such as an ETF. However, the analog signal may be provided by a variety of sources other than an ETF.

Another embodiment provides a method for performing analog-to-digital conversion using an ADC. During operation, the ADC receives an analog signal. Then, the ADC converts the analog signal into a corresponding digital value based on a set of references, where the set of references includes a range of values of the analog signal. Moreover, the ADC selects a second set of references based on the digital value, where the second set of references span a range of values that is less than the range of values of the analog signal, and where the second set of references is a subset of the set of references. For example, the ADC may dynamically select the second set of references based on the digital value. Next, the ADC refines the digital value into a second digital value using an averaging converter that converts the analog signal into the corresponding second digital value based on the second set of references.

Another embodiment provides an electronic device that includes an embodiment of the ADC.

BRIEF DESCRIPTION OF THE DRAWINGS

Note that like reference numerals refer to corresponding parts throughout the drawings. Moreover, multiple instances of the same part are designated by a common prefix separated from an instance number by a dash.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the claims.

Embodiments of an analog-to-digital converter (ADC), an electronic device that includes the ADC, and a method for performing analog-to-digital conversion are described. The ADC converts an analog signal into a digital value using a two-pass digitization process. In a first operation, coarse digitization is performed by an averaging converter based on a set of references. Then, in a second operation, fine digitization is performed by either another averaging converter or the same averaging converter with a subset of the set of references that are progressively closer to an instantaneous value of the analog signal. For example, the coarse digitization may be performed by a low-resolution ADC stage and the fine digitization may be performed by a sigma-delta ADC, such as a single-bit sigma-delta ADC. Moreover, the other or the same averaging converter may use dynamic element matching to shuffle reference elements used to generate the subset.

By using a cascaded digitization process, the ADC may provide: high precision, reduced nonlinearity, and reduced quantization noise. This ADC may facilitate digitizing of a phase characteristic that is a function of a physical variable, such as the output of an electrothermal filter (ETF)-based temperature sensor. Therefore, the ADC may facilitate a highly accurate, integrated temperature sensor, which may address long-standing needs in a wide variety of applications.

We now describe embodiments of the ADC. Quantization noise is, by definition, a fraction of the span of the references used by an ADC. By reducing this span to a narrow band around the input analog signal, the quantization noise of an ADC can be reduced. However, a narrow range of references can easily be exceeded by the input signal leading to out of range errors.

This problem can be addressed by combining two moderate resolution ADCs, and may use less resources than a single high-resolution ADC. During a coarse digitization operation, the approximate digital value of the analog signal is determined by a first ADC (which performs coarse conversion). Then, modified references are chosen that just straddle the input analog signal. During a fine digitization operation, these modified references are used by a second ADC (which performs fine conversion).

Figure 8:
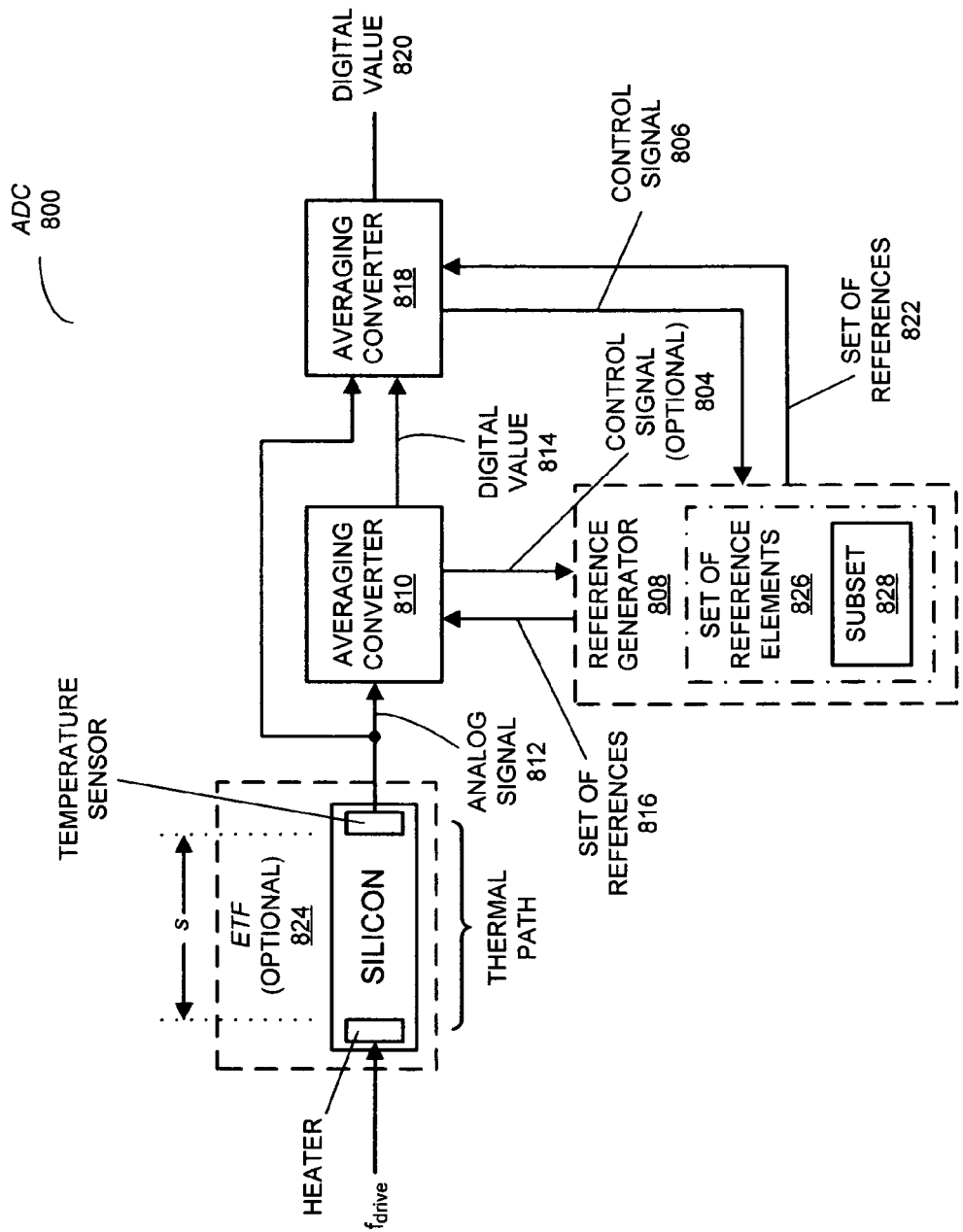
FIG. 8 is a block diagram illustrating an ADC in accordance with an embodiment.

This analog-to-digital conversion technique is illustrated in FIG. 8, which presents a block diagram illustrating an ADC 800. This ADC includes an averaging converter 810 that receives an analog signal 812 and outputs a digital value 814 corresponding to analog signal 812 based on a set of references 816 (which may be provided by reference generator 808), where set of references 816 includes a range of values of analog signal 812. Note that an averaging converter (such as averaging converter 810) outputs a digital value (such as digital value 814) that is a weighted average of an analog signal (such as analog signal 812) during a conversion time (for example, a fraction of a time scale in which the temperature changes or a fraction of a second).

Moreover, ADC 800 includes an averaging converter 818 that receives analog signal 812 and outputs a digital value 820 corresponding to analog signal 812 based on a set of references 822, where averaging converter 818 selects set of references 822 based on digital value 814 (for example, by outputting a control signal 806 to reference generator 808). In some embodiments, averaging converter 818 dynamically selects set of references 822 based on digital value 814. Note that set of references 822 is a subset of the set of references 816 and, in aggregate, is closer to an instantaneous value of analog signal 812 than set of references 816. By refining set of references 822 based on digital value 814, set of references 822 may facilitate more linear operation of averaging converter 818 relative to averaging converter 810. In particular, using set of references 822, digital value 820 output by averaging converter 818 may have a more linear relationship to analog signal 812 than digital value 814 output by averaging converter 810.

This analog-to-digital conversion technique may be appropriate when analog signal 812 is noisy (where a faster technique, such as direct conversion, is more likely to make large errors), because the coarse digitization operation in the first stage (for example, using a sigma-delta ADC, a single-slope ADC, a pulse-width modulation ADC, a duty-cycle modulation ADC, or a dual-slope ADC) is more robust in the presence of noise. [Note that a sigma-delta ADC includes a sigma-delta modulator followed by a decimation filter that converts the bit-stream output by the sigma-delta modulator into a digital word or value. The decimation filter also restricts the noise bandwidth in the system and so improves the signal-to-noise ratio of the resulting digital value.] Furthermore, the fine digitization operation may use an averaging converter (for example, a second sigma-delta ADC, a second single-slope ADC, a second pulse-width modulation ADC, a second duty-cycle modulation ADC, or a second dual-slope ADC), because its averaging property can be used to ensure that the average value of the references (i.e., set of references 822) are accurately positioned vis-a-vis (e.g., have a linear relation with respect to) set of references 816 used during the coarse conversion.

As an example, consider an embodiment where a set of reference elements 826 (such as a chain of resistors, capacitors or digital delay elements) is used to generate set of references 816 (such as reference voltages), and a subset 828 of set elements 826 (such as another chain of resistors, capacitors or digital delay elements) is used to generate set of references 822 (such as a subset of the reference voltages). For example, subset 828 may establish voltage taps on the resistor chain. However, in practice the resistors in the resistor chain will not be identical. Therefore, set of references 822 may contain errors and may have a nonlinear relationship to set of references 816. To address this problem, averaging converter 818 may dynamically select subset 828 of set of reference elements 826 used to generate set of references 822, thereby increasing the accuracy of the reference elements in subset 828. For example, averaging converter 818 may use dynamic element matching to shuffle the reference elements in a reference divider in order to reduce the average error of the reference elements. (More generally, subset 828 may be dynamically selected during, different time intervals by averaging converter 818 based on digital value 814, digital value 820, analog signal 812 and/or a quality metric, such as a nonlinearity of averaging converter 818.) An averaging converter, such as a sigma-delta ADC, lends itself very well to the use of dynamic element matching.

In an exemplary embodiment, an RC network includes a resistor-based temperature sensor which has a temperature-sensitive resistance. This RC network is driven by drive signal having a particular fundamental frequency, and the resulting temperature-dependent phase-shift is then digitized. Because of a large spread or variance in the value of on-chip time constants, the spread in the phase-shift may be as large as 50%. Using a two-stage digitizing process provided by one of the disclosed embodiments of the ADC, such as wide range of phases can be digitized in a linear manner.

In some embodiments, averaging converter 810 includes a sigma-delta ADC, averaging converter 818 includes a second sigma-delta ADC, and at least one of the sigma-delta ADC and the second sigma-delta ADC include a first-order sigma-delta ADC. Alternatively, at least one of the sigma-delta ADC and the second sigma-delta ADC may include an $n^{th}$-order sigma-delta ADC, where n is greater than one. [Note that an $n^{th}$-order sigma-delta ADC may include n cascaded integrators in the loop.] In some embodiments, at least one of the sigma-delta ADC and the second sigma-delta ADC includes a single-bit sigma-delta ADC.

In general, a first-order sigma-delta ADC is simpler and has lower power consumption that an $n^{th}$-order sigma-delta ADC. This is because higher-order sigma-delta ADCs generally have two or more integrators in the loop. However, higher-order sigma-delta ADCs can provide faster conversion time and, in some cases, may offer a reduction in the over-all energy consumption (at the cost of increased complexity and reduced stability).

As described further below with reference to FIG. 9, in the case of a high-resolution phase-domain ADC the analog-to-digital conversion technique may be used to correct the inherent nonlinearity of a phase-domain sigma-delta (PDΣΔ) ADC. In particular, the phase-subtractor (which is a synchronous phase detector) in a PDΣΔ ADC typically has a cosine characteristic. The two-stage analog-to-digital conversion technique may be used to ensure that the phase references in subset 828 during the fine conversion exactly straddle analog signal 812, thereby ensuring that averaging converter 818 is used in its linear region. (Thus, averaging converter 818 may include a PDΣΔ ADC that determines digital value 820 based on a phase of analog signal 812, and set of references 822 may be selected so that the PDΣΔ ADC determines digital value 820 in a linear region of operation of the PDΣΔ ADC. In particular, note that, excluding optional ETF 824, ADC 800 may be a phase-detection circuit.) Although the coarse conversion will be nonlinear, the nonlinearity is well defined, and so averaging converter 818 may select appropriate phase references in set of references 822 for the fine conversion based on digital value 814 and: a look-up table and/or a nonlinear function. For example, averaging converter 818 may select appropriate phase references in set of references 822 using a cubic spline and/or an interpolation technique.

In some embodiments, analog signal 812 is provided by a filter having a phase characteristic that is a function of a physical variable. For example, analog signal 812 may be provided by an optional temperature sensor, such as at least one optional ETF 824. In these embodiments, ADC 800 may be used to accurately digitize a phase value output by optional ETF 824.

In particular, while not shown in FIG. 8, a drive circuit (such as a voltage-controlled oscillator or VCO and, more generally, an oscillator circuit) may provide a drive signal (such as an analog electrical drive signal, which may be a continuous or a pulse signal) having the fundamental frequency $f_{drive}$ to optional ETF 824. In response to the drive signal, optional ETF 824 may output analog signal 812 (such as an analog electrical output signal) having the fundamental frequency and a phase ($\phi_{ETF}$) relative to the drive signal (i.e., a phase shift) corresponding to a temperature-dependent time constant of the ETF. Furthermore, ADC 800 may measure a phase-shift value of $\phi_{ETF}$ and output digital value 820.

Note that optional ETF may include: a heater (such as an n$^+$-diffusion heater) that receives the drive signal, a thermal (i.e., heat-diffusion) path, and a temperature sensor (such as a p$^+$-diffusion/aluminum thermopile). In optional ETF 824, the thermal path may include a semiconductor (such as silicon) having the temperature-dependent time constant, and the temperature sensor may provide analog signal 812. Moreover, in optional ETF 824 the thermal path may include a material other than the semiconductor (such as an insulator, polysilicon and/or an oxide).

Figure 9A:
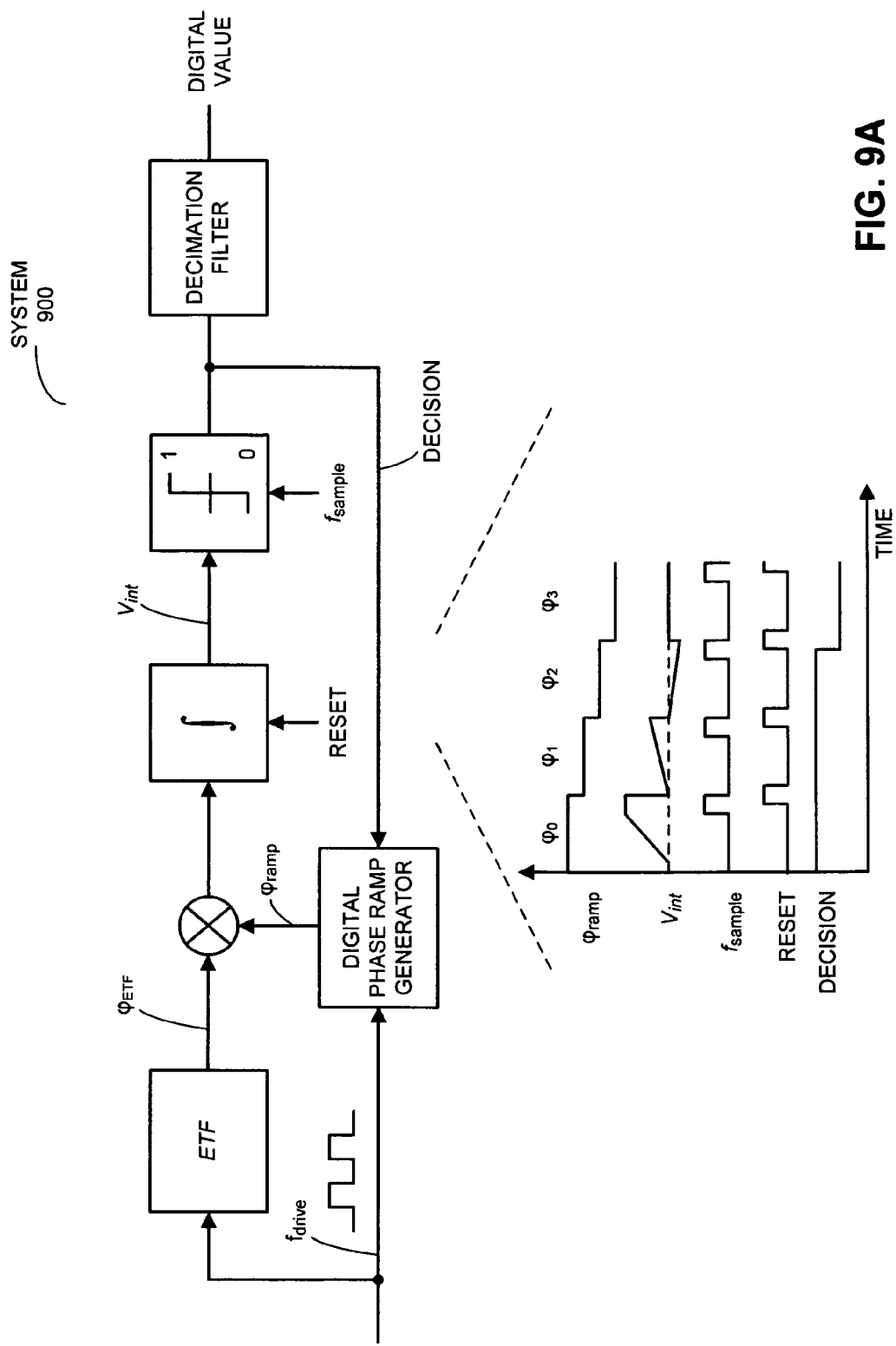
FIG. 9A is a block diagram illustrating a system that includes an ADC in accordance with an embodiment.
Figure 9B:
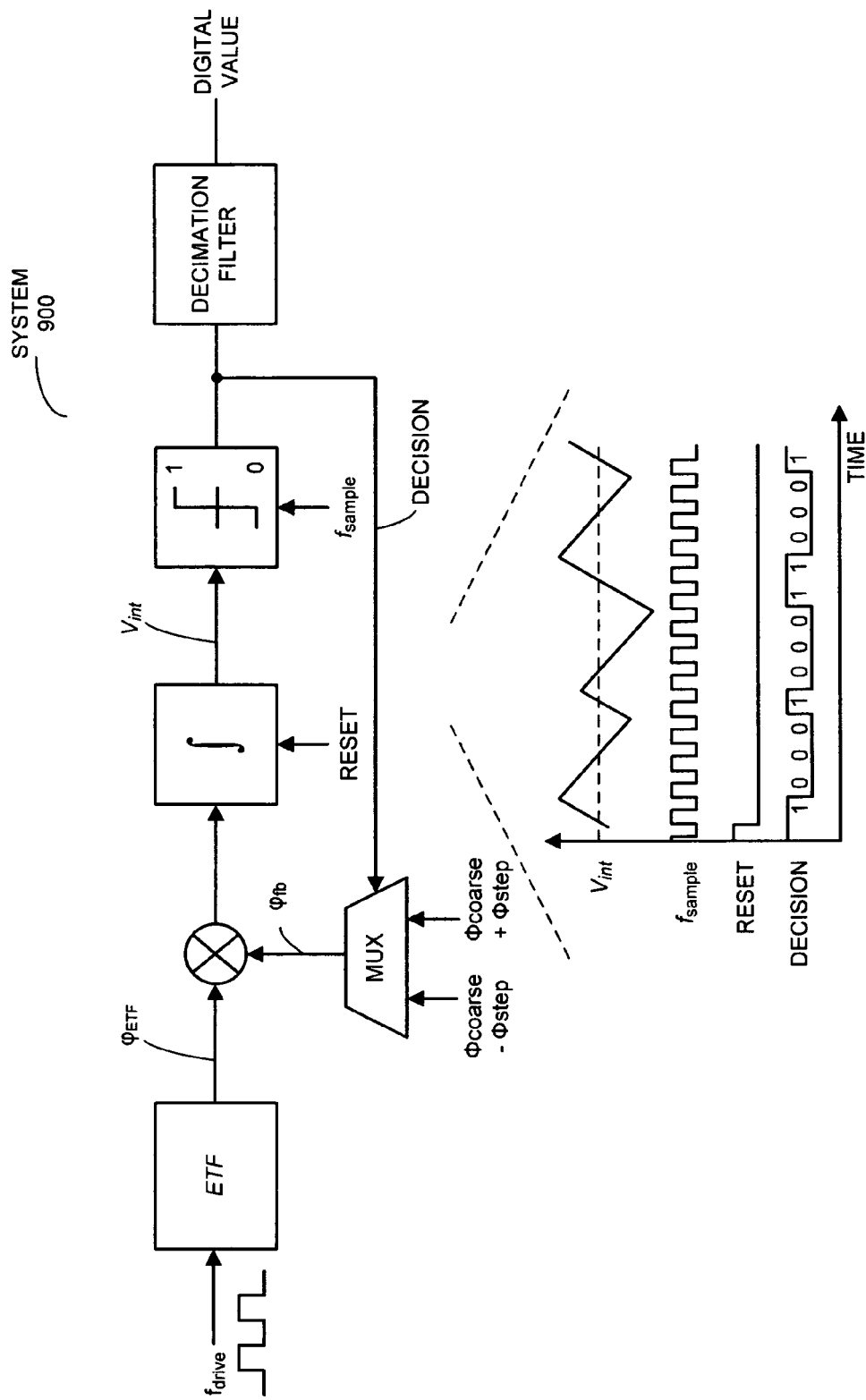
FIG. 9B is a block diagram illustrating a system that includes an ADC in accordance with an embodiment.

In an exemplary embodiment, averaging converter 810 includes a single-slope ADC (alternatively, a successive-approximation or another low-resolution ADC can be used), and averaging converter 818 includes a PDΣΔ ADC. This is shown in FIGS. 9A and 9B, which presents block diagrams illustrating operation of a system 900 that includes an ETF and an ADC (the components in system 900 other than the ETF) during the coarse digitization and the fine digitization. This ADC can significantly reduce the nonlinearity and quantization error of the PDΣΔ ADC.

Figure 6:
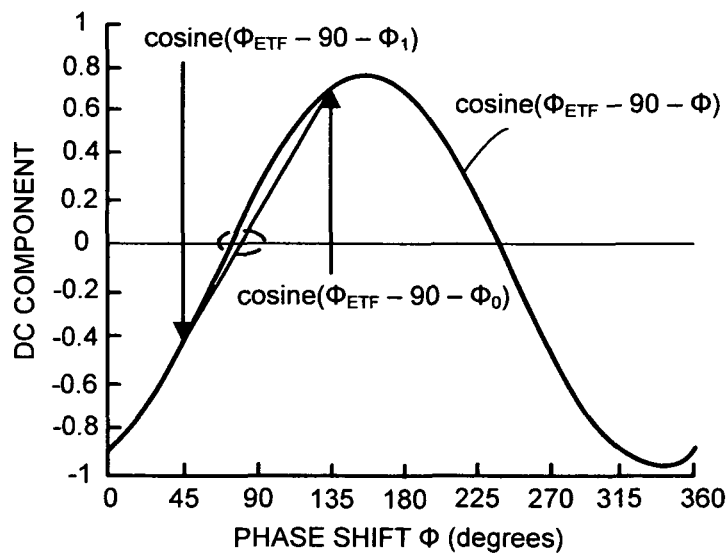
FIG. 6 is a graph illustrating phase interpolation in the PDΣΔ ADC in FIG. 4.
Figure 7:
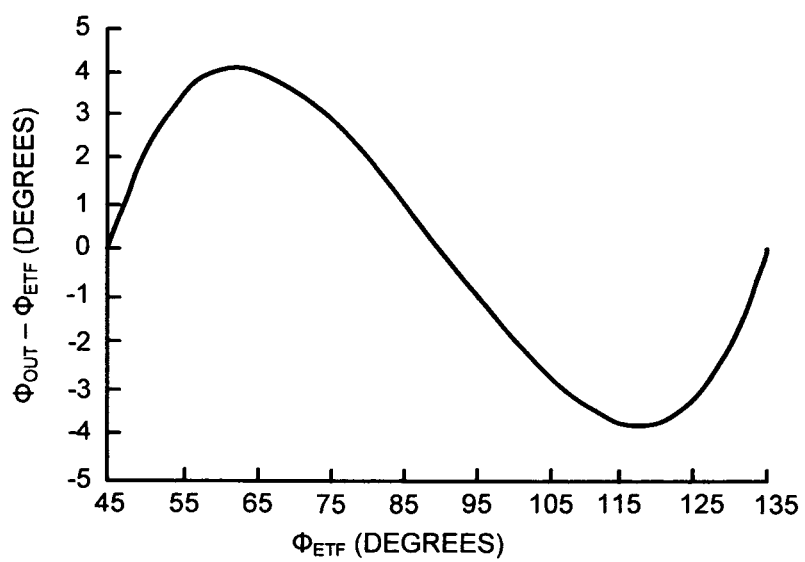
FIG. 7 is a graph illustrating nonlinearity of the PDΣΔ ADC in FIG. 4.

As discussed previously, FIG. 6 shows that the PDΣΔ ADC is nonlinear because of cosine distortion. However, note that, for values close to 90°, the cosine function is near-linear. As a consequence, by reducing the distances $|\phi_{ETF}-\phi_0|$ and $|\phi_{ETF}-\phi_1|$, to near zero, the linearity of the PDΣΔ ADC can be increased. The magnitude of the worst-case nonlinear error as a function of $|\phi_1-\phi_0|$ is proportional to $|\phi_1-\phi_0|^3$.

Figure 1:
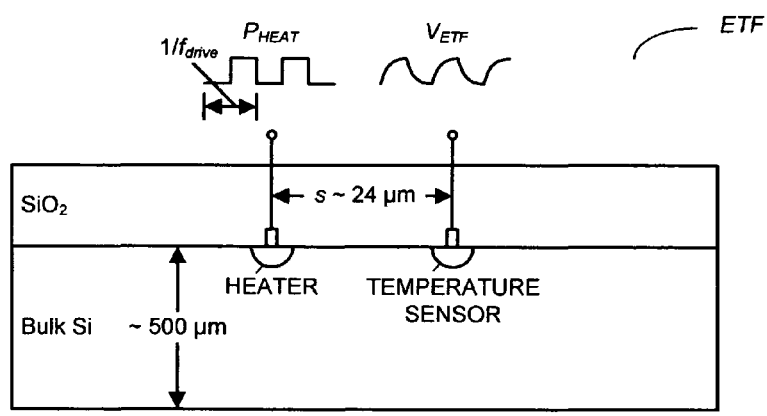
FIG. 1 is a drawing illustrating an existing electrothermal filter (ETF) implemented on a silicon substrate.
Figure 2:
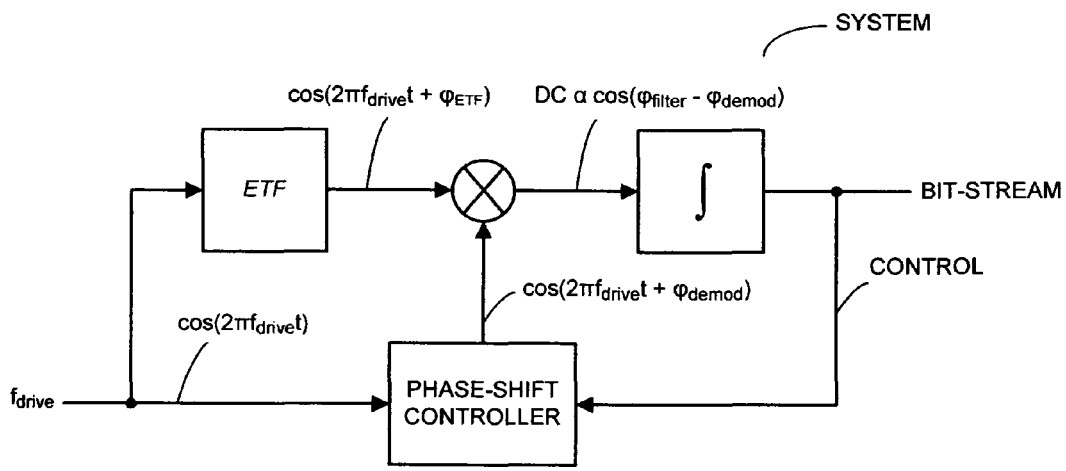
FIG. 2 is a block diagram illustrating an existing system that includes an ETF and a phase-detection circuit.
Figure 3:
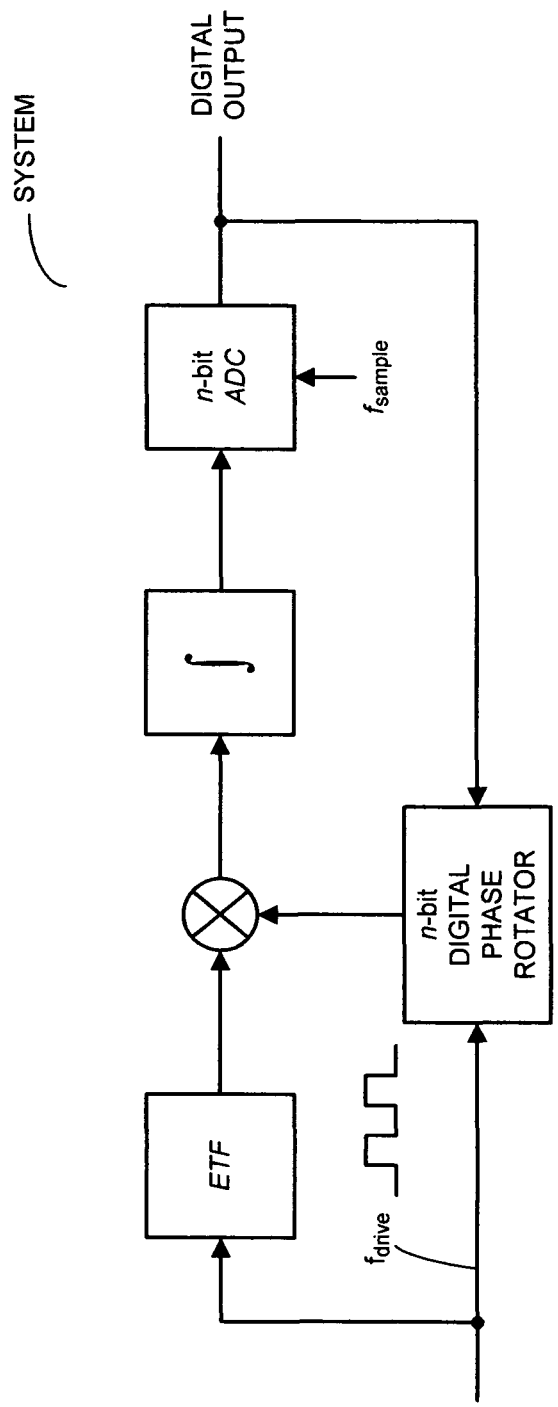
FIG. 3 is a block diagram illustrating an existing system that includes an ETF and a phase-detection circuit.
Figure 4:
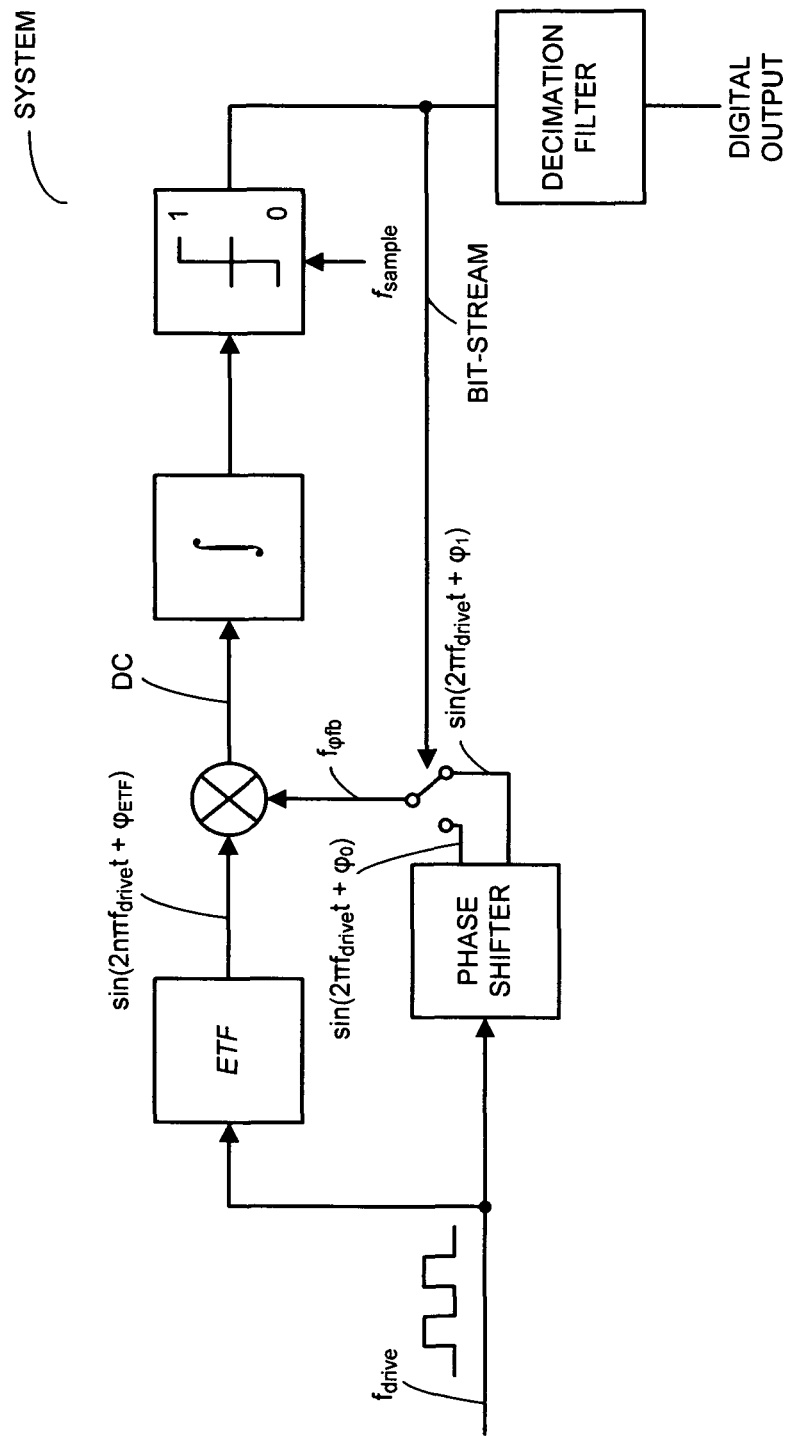
FIG. 4 is a block diagram illustrating an existing system that includes an ETF and a phase-domain sigma-delta (PDΣΔ) analog-to-digital converter (ADC).
Figure 5:
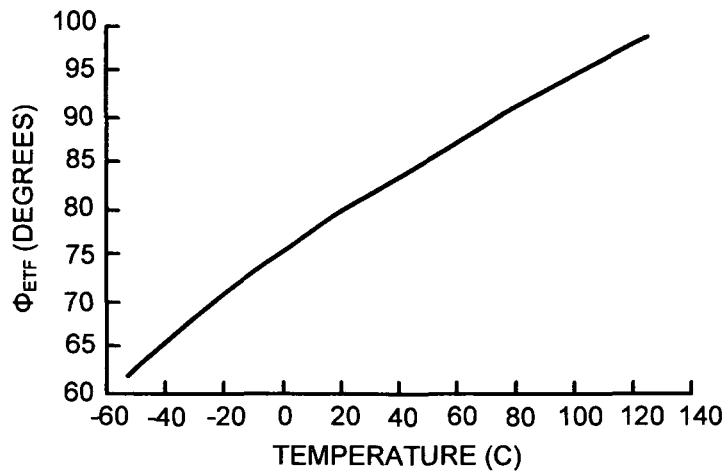
FIG. 5 is a graph illustrating a measured ETF phase characteristic of the PDΣΔ ADC in FIG. 4.

While the PDΣΔ ADC is indeed very linear for small values of $|\phi_0-\phi_1|$, for such small input ranges it may not be able to digitize an ETF's phase shift (as illustrated in FIG. 5) at all temperatures. Therefore, in a single-bit PDΣΔ ADC the input and the nonlinearity are strongly coupled.

If the signal to be detected is relatively slow (e.g., changes in temperature, changes on the order of seconds, etc.), another solution is possible: the input range and nonlinearity can be decoupled by performing a two-stage phase digitization. In the first stage, the input phase ($\phi_{ETF}$) is coarsely digitized by a single-slope ADC (for example, the first stage may have a resolution of at least 4 bits.) Then, in the second stage, fine conversion is performed by the PDΣΔ ADC.

During the first stage, the ETF output signal is multiplied with another signal at $f_{drive}$ whose phase shift, $\phi_{ramp}$, starts at 45° (the original $\phi_1$) and is ramped downwards in $\phi_{step}$ decrements. For each step, the multiplier output is integrated for 32 sampling periods, after which a sampled comparator detects the polarity of $V_{int}$. Because the DC component of the multiplier is approximately proportional to the cosine of $\phi_{ETF}-\phi_{ramp}$, the comparator detects a zero crossing when $\phi_{ETF}-\phi_{ramp}$ is greater than or equal to 90°. At this point, the instantaneous value of $\phi_{ramp}$ is stored as $\phi_{coarse}$, and the integrator is reset.

In the second digitization stage, two phase references $\phi_0$ and $\phi_1$ (which are equal to $\phi_{coarse}\pm\phi_{step}$) define the input range of a first-order, single-bit PDΣΔ ADC, whose decimated output $\phi_{fine}$ represents a weighted average of $\phi_0$ and $\phi_1$. Because $\phi_{ETF}$ is already coarsely known, the input range of the PDΣΔ ADC can be significantly reduced, from ±45° to, for example, ±2.8125°. This reduces its quantization error by 16× (and, more generally, by at least 10-20×), and reduces the cosine nonlinearity associated with the multiplying phase detector by approximately 4700, thereby enabling accurate phase detection. The two-stage phase ADC outputs a phase shift $\phi_{out}$ equal to $\phi_{coarse}+\phi_{fine}$ and has a measured accuracy of greater than 16 bits. (In other embodiments, the ADC in system 900 has at least 10-bit resolution, and may have at least 15-bit resolution.) Note that residual errors due to nonlinearity are now at the noise level.

The minimum step size, $\phi_{step}$, by which the total phase range can be divided, may be determined by the ratio $f_{ref}/f_{drive}$ in which $f_{ref}$ is a high reference frequency that is used to synchronously delay $f_{drive}$ (for example, using a cascaded chain of D flip-flops, which are each coupled to $f_{ref}$ and $f_{drive}$, and which provide phase steps from successive stages in the cascaded chain) In the preceding example, $f_{ref}$ equals 6.4 MHz and $f_{drive}$ equals 50 kHz, so that the minimum $\phi_{step}$ is 2.8215°.

Note that as the size of the desired nonlinearity is reduced, $f_{ref}$ is increased. For example, in order to obtain a smaller nonlinearity, a smaller value of $\phi_{step}$ (and, thus, more phase references) is usually needed. These finely spaced phase-shift references are typically generated by delaying $f_{drive}$ using synchronous digital logic clocked at $N \cdot f_{drive}$, in which N is the number of phase steps that can be achieved ($\phi_{step}$ equals 360°/N). A phase accuracy below 1 m° may require that N is greater than or equal to 128, so that for an $f_{drive}$ of 100 kHz $f_{ref}$ may be greater than 12.8 MHz. In the case of scaled ETFs in microprocessors, $f_{drive}$ may increase to several MHz, but frequencies of several GHz may be available to generate sufficiently small phase steps. In other applications, the digital logic in modern IC technology is typically fast enough to accurately generate the desired frequencies, but there may be a tradeoff between the desired nonlinearity and the resulting power consumption and digital circuit area.

Furthermore, note that, while the preceding example noted that the ADC is useful for slowly varying input signals, more generally the response time of the ADC is related to the resolution. For example, for a first-order ADC (in either of the two stages) the resolution is inversely related to the number of clock cycles M. Therefore, for 10-bit resolution, 1024 steps (and, thus, an equivalent number of clock cycles) may be needed. Additionally, if dynamic element matching is used, another constraint on the response time of the ADC (and, thus, on the rate of change of the input signal) is the time needed to shuffle around the reference elements in the reference chain. For example, K reference elements would require at least K clock cycles, and more clock cycles would be required if more than two subsets of the reference elements have to be shuffled.

Figure 10:
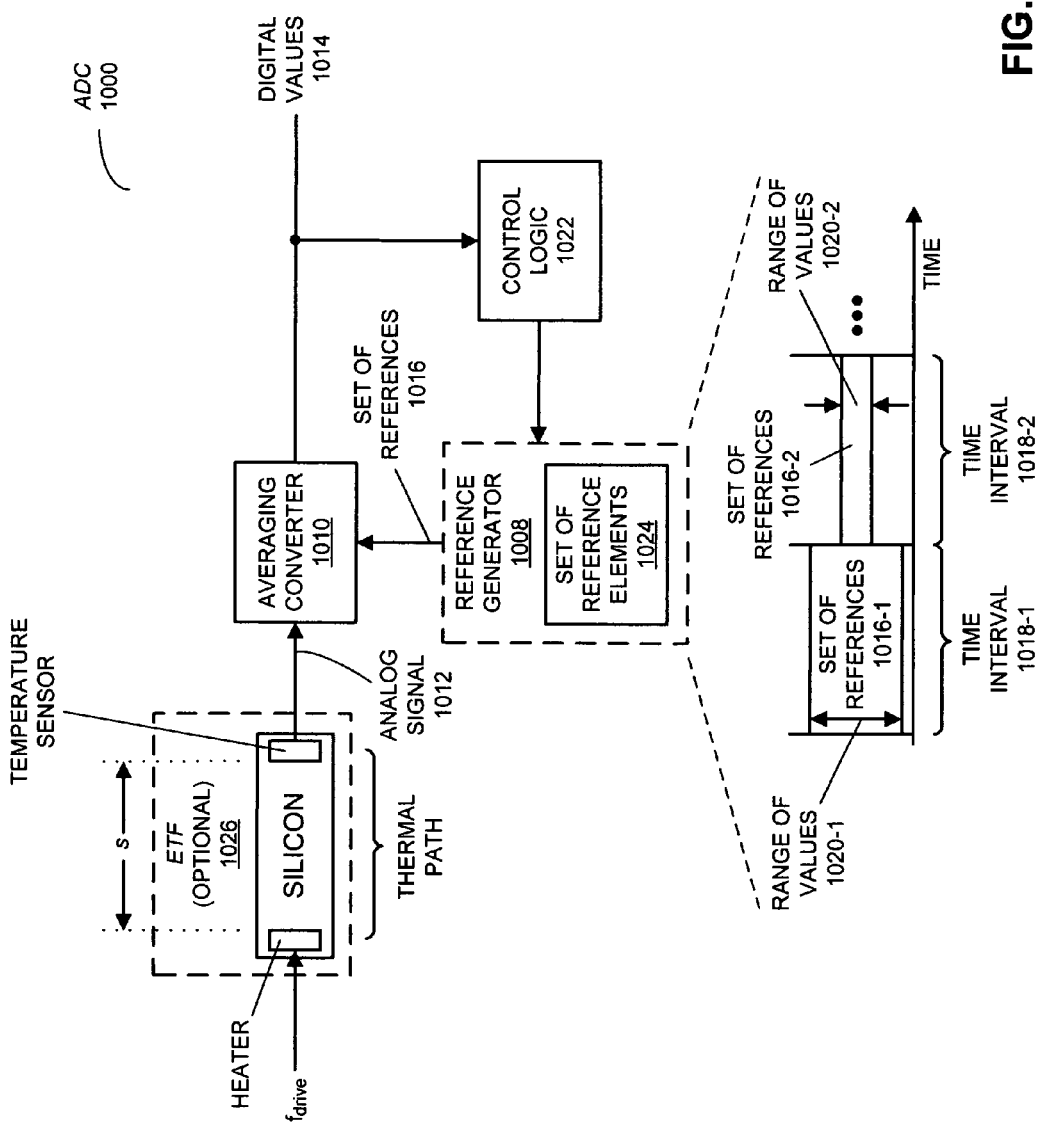
FIG. 10 is a block diagram illustrating an ADC in accordance with an embodiment.

While the preceding discussion illustrated the analog-to-digital conversion technique using a two-stage ADC, in other embodiments averaging converter 810 and averaging converter 818 in FIG. 8 are physically implemented by reconfiguring the references applied to a single averaging converter. This is shown in FIG. 10, which presents a block diagram illustrating an ADC 1000. This ADC includes an averaging converter 1010 that receives an analog signal 1012 and outputs digital values 1014 corresponding to analog signal 1012 based on a set of references 1016 (which may be provided by reference generator 1008) during time intervals 1018, where, in a given time interval (such as time interval 1018-2), set of references 1016 includes a given range of values (such as range of values 1020-2). Moreover, ADC 1000 includes control logic 1022 that dynamically adjusts the given range of values during the given time interval based on a digital value corresponding to analog signal 1012 determined in a preceding time interval (such as time interval 1018-1), where the given range of values in the given time interval is less than or equal to another range of values (such as range of values 1020-1) in the preceding time interval.

Note that set of references 1016 during the given time interval may be generated using at least a subset of a set of reference elements 1024, where, during the given time interval, control logic 1022 dynamically selects at least the subset of set of reference elements 1024 used to generate set of references 1016 (i.e., control logic 1022 may implement dynamic element matching). More generally, the subset of set of reference elements 1024 may be dynamically selected during different time intervals by control logic 1022 based on digital the value during a previous time interval, the digital value during a current time interval, analog signal 1012 and/or a quality metric, such as a nonlinearity of averaging converter 1010. In some embodiments, control logic 1022 dynamically selects at least the subset of set of reference elements 1024 using a look-up table and/or a nonlinear function. For example, control logic 1022 may select appropriate phase references in set of references 1024 using a cubic spline and/or an interpolation technique.

In some embodiments, averaging converter 1010 includes: a sigma-delta ADC, a single-slope ADC, a pulse-width modulation ADC, a duty-cycle modulation ADC, and/or a dual-slope ADC. For example, averaging converter 1010 may include a sigma-delta ADC, and the sigma-delta ADC may include a first-order sigma-delta ADC. Alternatively, the sigma-delta ADC may include an $n^{th}$-order sigma-delta ADC, where n is greater than one. In some embodiments, the sigma-delta ADC includes a single-bit sigma-delta ADC.

Furthermore, averaging converter 1010 may include a PDΣΔ ADC that determines digital values 1014 based on a phase of analog signal 1012, and control logic 1022 may select set of references 1016 so that the PDΣΔ ADC determines digital values 1014 in a linear region of operation of the PDΣΔ ADC.

In some embodiments, analog signal 1012 is provided by a filter having a phase characteristic that is a function of a physical variable. For example, analog signal 1012 may be provided by an optional temperature sensor, such as at least optional ETF 1026.

In an exemplary embodiment, an embodiment of the ADC was used to implement a temperature sensor with a pair of ETFs with different thermal time constants (for example, the thermal time constant of one of the ETFs may be dominated by the thermal diffusivity of silicon and the thermal time constant of the other ETF may be dominated by the thermal diffusivity of silicon dioxide). The inaccuracy of an implementation of the temperature sensor from −70 to 200 C was measured to be ±0.4 C (3σ). With a 5 V supply, the power consumption of the temperature sensor was about 5 mW. Furthermore, continuous operation of the ETFs in the temperature sensor resulted in a temperature-sensing resolution of 0.075 C (rms) at 0.7 conversions/second.

In another exemplary embodiment, an embodiment of the ADC was used to implement an electrothermal frequency-locked loop (EFLL). The inaccuracy of this EFLL was measured to be below 250 ppm.

Figure 11:
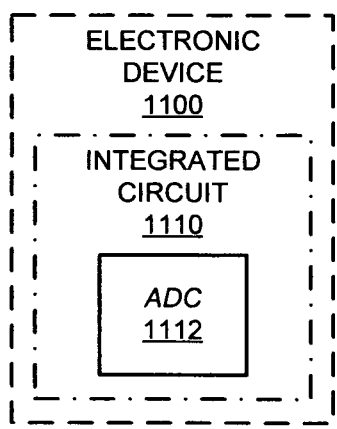
FIG. 11 is a block diagram of an electronic device that includes an ADC in accordance with an embodiment.

The preceding embodiments of the ADC may be used in a wide variety of applications, including: an integrated (on-chip) temperature sensor, a discrete temperature sensor, intra-chip communication, inter-chip communication, an integrated frequency reference, a clock source for use in one or more time domains, a multi-core processor, a server, a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, a portable electronic device (such as a personal digital assistant, an MP3 player and a cellular telephone) and/or a non-portable electronic device. As a general illustration, FIG. 11 presents a block diagram of an electronic device 1100 that includes an ADC 1112, such as one of the preceding embodiments of the ADC. For example, ADC 1112 may be disposed on an integrated circuit 1110 in electronic device 1100.

While the present disclosure has been described in connection with specific embodiments, the claims are not limited to what is shown. Consequently, the preceding embodiments may include fewer components or additional components. For example, in an ETF-based temperature sensor the digital output may be compensated for by at least a single-point calibration to correct for process variations and/or other error sources. Thus, the phase detector may provide the digital value based on a calibration setting or a trim setting (such as a temperature-calibration setting), which may have been determined by comparing the digital value to a reference, and which may reduce errors in the digital value. This temperature-calibration setting may be stored in an optional storage component, such as: a non-volatile memory, an array of resistors, a memory circuit and/or a fusable link. Note that the calibration setting may be determined from the coefficients of a polynomial, which may be implemented in the digital domain. For example, a fifth-order polynomial may be used.

Alternatively or additionally, a look-up table, a cubic spline and/or an interpolation technique may be used.

In some embodiments, the averaging converter in the ADC has high resolution (for example, greater than or equal to 8 bits) in the first, coarse digitizing operation. This may be useful when a successive-approximation-register converter is no longer convenient because of matching requirements. In particular, the averaging converter may provide extra resolution. In addition, dynamic element matching may be used to adapt the set of references used by the averaging converter. Thus, in FIG. 8, during different time intervals averaging converter 810 may dynamically select set of reference elements 826 used to generate set of references 816 (for example, by providing an optional control signal 804 to reference generator 808). This selection may be based on digital value 814, analog signal 812 and/or a quality metric (such as a nonlinearity of averaging converter 810).

Moreover, two or more components in one or more of the preceding embodiments may be combined into a single component and/or a position of one or more components may be changed.

In the preceding embodiments, some components are shown directly connected to one another, while others are shown connected via intermediate components. In each instance the method of interconnection, or 'coupling,' establishes some desired electrical communication between two or more circuit nodes, or terminals. Such coupling may often be accomplished using a number of circuit configurations, as will be understood by those of skill in the art, for example, AC coupling and/or DC coupling may be used.

In some embodiments, functionality in these circuits, components and devices is implemented in hardware and/or in software as is known in the art. For example, some or all of the functionality of these embodiments may be implemented in one or more: application-specific integrated circuit (ASICs), field-programmable gate array (FPGAs), and/or one or more digital signal processors (DSPs). Furthermore, the circuits and components may be implemented using bipolar, PMOS and/or NMOS gates or transistors, and signals in these embodiments may include digital signals that have approximately discrete values and/or analog signals that have continuous values. Thus, the drive signal in FIG. 8 may be a continuous signal or a pulsed signal (such as a signal with pulses at edges that correspond to $f_{drive}$). Additionally, components and circuits may be single-ended or differential, and power supplies may be unipolar or bipolar.

Furthermore, while the implementation of the ETFs in the preceding embodiments was illustrated using a semiconductor substrate (such as silicon), a wide variety of materials with a temperature-dependent thermal diffusivity (such as a ceramic or a plastic) can be used in other embodiments. Alternatively or additionally, the underlying principle of the device may be applied to other physical phenomenon in addition to or separate from the temperature-dependent thermal diffusivity of the semiconductor or the material in the ETFs. For example, using a suitable plastic substrate, hydroscopic effects (such as those associated with relative-humidity changes) or adhesion of a chemical (such as a gas or a compound that reacts with the material) may be used to modify the thermal diffusivity of one or more ETFs in a predefined or predetermined manner. This can form the basis of a closed-loop compensated circuit (such as an EFLL) and, thus, a sensor for the other physical phenomenon.

More generally, the ADC may be used to digitize an analog signal in a wide variety of applications, including applications other than those based on an ETF. Thus, the embodiments of the ADC are not limited to temperature sensing, but are suited to sensing other, slowly-varying signals (such as signals that do not change significantly, for example, by more than one least significant bit, between the two stages) and/or other filters for which the phase behaviour is of interest (for example, in a thermal-conductivity-based gas sensors).

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in: Caltech Intermediate Format (CIF), Calma GDS II Stream Format (GDSII) or Electronic Design Interchange Format (EDIF). Those of skill in the art of integrated circuit design can develop such data structures from schematic diagrams of the type detailed above and the corresponding descriptions and encode the data structures on a computer-readable medium. Those of skill in the art of integrated circuit fabrication can use such encoded data to fabricate integrated circuits comprising one or more of the circuits described herein.

Figure 12:
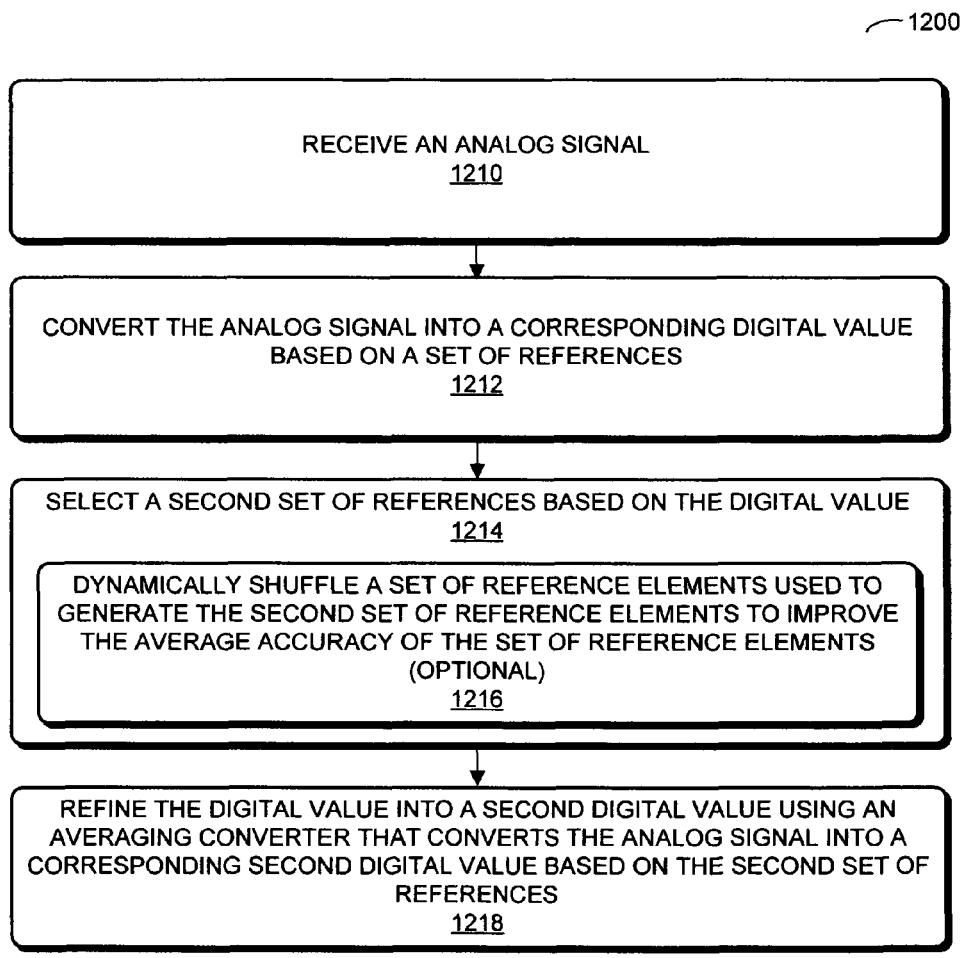
FIG. 12 is a flow chart illustrating a method for performing analog-to-digital conversion using an ADC in accordance with an embodiment.

We now describe embodiments of the method. FIG. 12 presents a flow chart illustrating a method 1200 for performing analog-to-digital conversion using an ADC, such as one of the preceding embodiments of the ADC. During operation, the ADC receives an analog signal (operation 1210). Then, the ADC converts the analog signal into a corresponding digital value based on a set of references (operation 1212), where the set of references includes a range of values of the analog signal. Moreover, the ADC selects a second set of references based on the digital value (operation 1214), where the second set of references span a range of values that is less than the range of values of the analog signal, and where the second set of references is a subset of the set of references. For example, the ADC may dynamically select the second set of references based on the digital value. In particular, the ADC may optionally dynamically shuffle a set of reference elements used to generate the second set of references to improve the average accuracy of the set of reference elements (operation 1216). Next, the ADC refines the digital value into a second digital value using an averaging converter that converts the analog signal into the corresponding second digital value based on the second set of references (operation 1218).

In some embodiments, method 1200 includes additional or fewer operations. Moreover, the order of the operations may be changed and/or two or more operations may be combined into a single operation.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. Therefore, the spirit and scope of the appended claims should not be limited to the foregoing description. Only those claims specifically reciting "means for" or "step for" should be construed in the manner required under the sixth paragraph of 35 U.S.C. §112.

What is claimed:

1. An analog-to-digital converter (ADC), comprising:
   an averaging converter configured to receive an analog signal and to output a digital value corresponding to the analog signal based on a set of references, wherein the set of references includes a range of values of the analog signal; and a second averaging converter, electrically coupled to the averaging converter, configured to receive the analog signal and to output a second digital value corresponding to the analog signal based on a second set of references, wherein the second averaging converter is configured to select the second set of references based on the digital value;

wherein the second set of references is a subset of the set of references;

wherein, in aggregate, the second set of references is closer to an instantaneous value of the analog signal than the set of references; and wherein the averaging converter includes one of: a sigma-delta ADC, a single-slope ADC, a pulse-width modulation ADC, a duty-cycle modulation ADC, and a dual-slope ADC; and wherein the second averaging converter includes one of a second sigma-delta ADC, a second single-slope ADC, a second pulse-width modulation ADC, a second duty-cycle modulation ADC, and a second dual-slope ADC.

2. The ADC of claim 1, wherein, using the second set of references, the second digital value output by the second averaging converter has a more linear relationship to the analog signal than the digital value output by the averaging converter.

3. The ADC of claim 1, wherein the set of references are generated using a set of reference elements and the second set of references are generated using a subset of the set of reference elements; and wherein the second averaging converter is configured to dynamically select the subset of the set of reference elements used to generate the second set of references.

4. The ADC of claim 1, wherein the averaging converter includes a sigma-delta ADC and the second averaging converter includes a second sigma-delta ADC; and wherein at least one of the sigma-delta ADC and the second sigma-delta ADC includes a first-order sigma-delta ADC.

5. The ADC of claim 1, wherein the averaging converter includes a sigma-delta ADC and the second averaging converter includes a second sigma-delta ADC;

wherein at least one of the sigma-delta ADC and the second sigma-delta ADC includes an $n^{th}$-order sigma-delta ADC; and wherein n is greater than one.

6. The ADC of claim 1, wherein the averaging converter includes a sigma-delta ADC and the second averaging converter includes a second sigma-delta ADC; and wherein at least one of the sigma-delta ADC and the second sigma-delta ADC includes a single-bit sigma-delta ADC.

7. The ADC of claim 1, wherein the averaging converter and the second averaging converter are physically implemented by reconfiguring references applied to a single averaging converter;

wherein first references applied to the single averaging converter during a first time interval implement the averaging converter; and wherein second references applied to the single averaging converter during a subsequent second time interval implement the second averaging converter.

8. The ADC of claim 1, wherein the second averaging converter includes a phase-domain sigma-delta (PDΣΔ) ADC configured to determine the second digital value based on a phase of the analog signal; and wherein the second set of references are selected so that the PDΣΔ ADC determines the second digital value in a linear region of operation of the PDΣΔ ADC.

9. The ADC of claim 1, wherein the second averaging converter is configured to select the second set of references based on the digital value and one of: a look-up table and a nonlinear function.

10. The ADC of claim 1, wherein the analog signal is provided by a filter having a phase characteristic that is a function of a physical variable.

11. An ADC, comprising:

an averaging converter configured to receive an analog signal and to output digital values corresponding to the analog signal based on a set of references during time intervals, wherein, in a given time interval, the set of references includes a given range of values, and wherein the averaging converter includes one of: a sigma-delta ADC, a single-slope ADC, a pulse-width modulation ADC, a duty-cycle modulation ADC, and a dual-slope ADC; and control logic, electrically coupled to the averaging converter, configured to dynamically adjust the given range of values during the given time interval based on a digital value corresponding to the analog signal determined in a preceding time interval, wherein the given range of values in the given time interval is less than or equal to another range of values in the preceding time interval.

12. The ADC of claim 11, wherein the set of references during the given time interval are generated using a subset of a set of reference elements; and wherein, during the given time interval, the control logic is configured to dynamically select the subset of the set of reference elements used to generate the set of references.

13. The ADC of claim 11, wherein the averaging converter includes a sigma-delta ADC; and wherein the sigma-delta ADC includes a first-order sigma-delta ADC.

14. The ADC of claim 11, wherein the averaging converter includes a sigma-delta ADC;

wherein the sigma-delta ADC includes an $n^{th}$-order sigma-delta ADC; and wherein n is greater than one.

15. The ADC of claim 11, wherein the averaging converter includes a sigma-delta ADC; and wherein the sigma-delta ADC includes a single-bit sigma-delta ADC.

16. The ADC of claim 11, wherein the averaging converter includes a PDΣΔ ADC configured to determine the digital values based on a phase of the analog signal; and wherein the control logic is configured to select the set of references so that the PDΣΔ ADC determines the digital values in a linear region of operation of the PDΣΔ ADC.

17. The ADC of claim 11, wherein the analog signal is provided by a filter having a phase characteristic that is a function of a physical variable.

18. A method for performing analog-to-digital conversion, comprising:

receiving an analog signal;

using an averaging converter, converting the analog signal into a corresponding digital value based on a set of references, wherein the set of references includes a range of values of the analog signal, wherein the averaging converter includes one of: a sigma-delta ADC, a single-slope ADC, a pulse-width modulation ADC, a duty-cycle modulation ADC, and a dual-slope ADC;

selecting a second set of references based on the digital value, wherein the second set of references span a range of values that is less than the range of values of the analog signal, and wherein the second set of references is a subset of the set of references; and refining the digital value into a second digital value using an averaging converter that converts the analog signal into the corresponding second digital value based on the second set of references.

* * * * *